(12) United States Patent
Lea

(10) Patent No.: US 11,222,260 B2
(45) Date of Patent: Jan. 11, 2022

(54) APPARATUSES AND METHODS FOR OPERATING NEURAL NETWORKS

(71) Applicant: Micron Technology, Inc., Boise, ID (US)

(72) Inventor: Perry V. Lea, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 755 days.

(21) Appl. No.: 15/466,296

(22) Filed: Mar. 22, 2017

(65) Prior Publication Data

US 2018/0276539 A1    Sep. 27, 2018

(51) Int. Cl.
*G06N 3/08* (2006.01)
*G06N 3/04* (2006.01)

(52) U.S. Cl.
CPC .............. *G06N 3/08* (2013.01); *G06N 3/0454* (2013.01)

(58) Field of Classification Search
CPC ............................... G06N 3/08; G06N 3/0454
See application file for complete search history.

(56) References Cited

U.S. PATENT DOCUMENTS

| | | |
|---|---|---|
| 4,380,046 A | 4/1983 | Fung |
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,165,009 A * | 11/1992 | Watanabe .............. G06N 3/063 706/41 |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

Auda et al., "Voting Schemes for Cooperative Neural Network Classifiers," Aug. 6, 2002, Proceedings of ICNN'95—International Conference on Neural Networks, (Year: 2002).*

(Continued)

*Primary Examiner* — Daniel C Puentes
(74) *Attorney, Agent, or Firm* — Brooks, Cameron & Huebsch, PLLC

(57) ABSTRACT

The present disclosure includes apparatuses and methods for operating neural networks. An example apparatus includes a plurality of neural networks, wherein the plurality of neural networks are configured to receive a particular portion of data and wherein each of the plurality of neural networks are configured to operate on the particular portion of data during a particular time period to make a determination regarding a characteristic of the particular portion of data.

26 Claims, 8 Drawing Sheets

(56) References Cited

U.S. PATENT DOCUMENTS

| | | |
|---|---|---|
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,317,785 B1 * | 4/2016 | Moon ................ G06K 9/00288 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |

(56) References Cited

U.S. PATENT DOCUMENTS

| | | |
|---|---|---|
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2005/0129306 A1 | 6/2005 | Wang et al. |
| 2005/0216426 A1 | 9/2005 | Weston et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0224532 A1 | 10/2006 | Duan et al. |
| 2006/0225072 A1 | 10/2006 | Lari et al. |
| 2006/0253491 A1* | 11/2006 | Gokturk .............. G06F 16/5838 |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0279466 A1 | 3/2015 | Manning |
| 2015/0120987 A1 | 4/2015 | Wheeler |
| 2015/0134713 A1 | 5/2015 | Wheeler |
| 2015/0254573 A1 | 9/2015 | Abu-Mostafa et al. |
| 2015/0270015 A1 | 9/2015 | Murphy et al. |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0365129 A1 | 12/2016 | Willcock |
| 2016/0371033 A1 | 12/2016 | La Fratta et al. |
| 2016/0379112 A1 | 12/2016 | He et al. |
| 2017/0052906 A1 | 2/2017 | Lea |
| 2017/0200079 A1* | 7/2017 | Amir .................... G06N 3/0635 |

FOREIGN PATENT DOCUMENTS

| | | |
|---|---|---|
| EP | 2026209 | 2/2009 |
| EP | 3104309 A2 | 12/2016 |
| JP | H07084984 | 3/1995 |
| JP | H0831168 | 2/1996 |
| JP | 2002117389 | 4/2002 |
| JP | 2009259193 | 3/2015 |
| KR | 10-0211482 | 8/1998 |
| KR | 20050059407 A | 6/2005 |
| KR | 10-2010-0134235 | 12/2010 |
| KR | 10-2013-0049421 | 5/2013 |

(56) References Cited

FOREIGN PATENT DOCUMENTS

| KR | 1020160127100 | 11/2016 |
|---|---|---|
| KR | 20160145482 A | 12/2016 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Yu et al, "Multistage RBF neural network ensemble learning forexchange rates forecasting", Neurocomputing, vol. 71, Issues 16-18, 2008, all pages (Year: 2008).*
Chi et al, "PRIME: A Novel Processing-in-memory Architecture for Neural Network Computation in ReRAM-based Main Memory, "Jun. 18, 2016, Proceedings of the 43rd International Symposium on Computer Architecture, pp. 27-39 (Year: 2016).*
Moreno-Montiel et al, "Parallel Classification System based on an Ensemble of Mixture of Experts", 2014, Proceedings of the 3rd International Conference on Pattern Recognition Applications and Methods, pp. 271-278 (Year: 2014).*
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
International Search Report and Written Opinion for PCT Application No. PCT/US2013/043702, dated Sep. 26, 2013, (11 pgs.).
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
Pagiamtzis, Kostas, "Content-Addressable Memory Introduction", Jun. 25, 2007, (6 pgs.), retrieved from: http://www.pagiamtzis.com/cam/camintro.
Debnath, Biplob, Bloomflash: Bloom Filter on Flash-Based Storage, 2011 31st Annual Conference on Distributed Computing Systems, Jun. 20-24, 2011, 10 pgs.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
"4.9 3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Stojmenovic, "Multiplicative Circulant Networks Topological Properties and Communication Algorithms", (25 pgs.), Discrete Applied Mathematics 77 (1997) 281-305.
Boyd et al., "On the General Applicability of Instruction-Set Randomization", July-Sep. 2010, (14 pgs.), vol. 7, Issue 3, IEEE Transactions on Dependable and Secure Computing.
Elliot, et al., "Computational RAM: Implementing Processors in Memory", Jan.-Mar. 1999, (10 pgs.), vol. 16, Issue 1, IEEE Design and Test of Computers Magazine.
Intenational Search Report and Written Opinion for related PCT Application No. PCT/US2018/021936, dated Jun. 25, 2018, 18 pages.
Chi et al., "PRIME: A Novel Processing-in-Memory Architecture for Neural Network Computation in ReRAM-Based Main Memory", 2016 ACM/IEEE 43rd Annual International Symposium on Computer Architecture (ISCA), Jun. 18-22, 2016, Seoul, South Korea, 13 pgs.
Extended European Search Report for related EP Patent Application No. 18770579.3, dated Dec. 10, 2020, 8 pages.
Notice of Rejection for related Japan Patent Application No. 2019-551437, dated Dec. 18, 2020, 11 pages.
Decision of Rejection for related Korea Patent Application No. 10-2019-7030239, dated Nov. 29, 2021, 8 pages.

\* cited by examiner

APPARATUSES AND METHODS FOR OPERATING NEURAL NETWORKS

TECHNICAL FIELD

The present disclosure relates generally to memory devices, and more particularly, to operating neural networks.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data (e.g., one or more operands). As used herein, an operation can be, for example, a Boolean operation, such as AND, OR, NOT, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of operations.

A number of components in an electronic system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be performed in one or multiple clock cycles through the functional unit circuitry, intermediate results of the instructions and/or data may also be sequenced and/or buffered. A sequence to complete an operation in one or more clock cycles may be referred to as an operation cycle. Time consumed to complete an operation cycle costs in terms of processing and computing performance and power consumption, of a computing apparatus and/or system.

In many instances, the processing resources (e.g., processor and associated functional unit circuitry) may be external to the memory array, and data is accessed via a bus between the processing resources and the memory array to execute a set of instructions. Processing performance may be improved in a processing-in-memory (PIM) device, in which a processing and/or logic resource may be implemented internally and/or near to a memory (e.g., directly on a same chip as the memory array). A processing-in-memory (PIM) device may save time by reducing and eliminating external communications and may also conserve

DETAILED DESCRIPTION

Figure 1A:
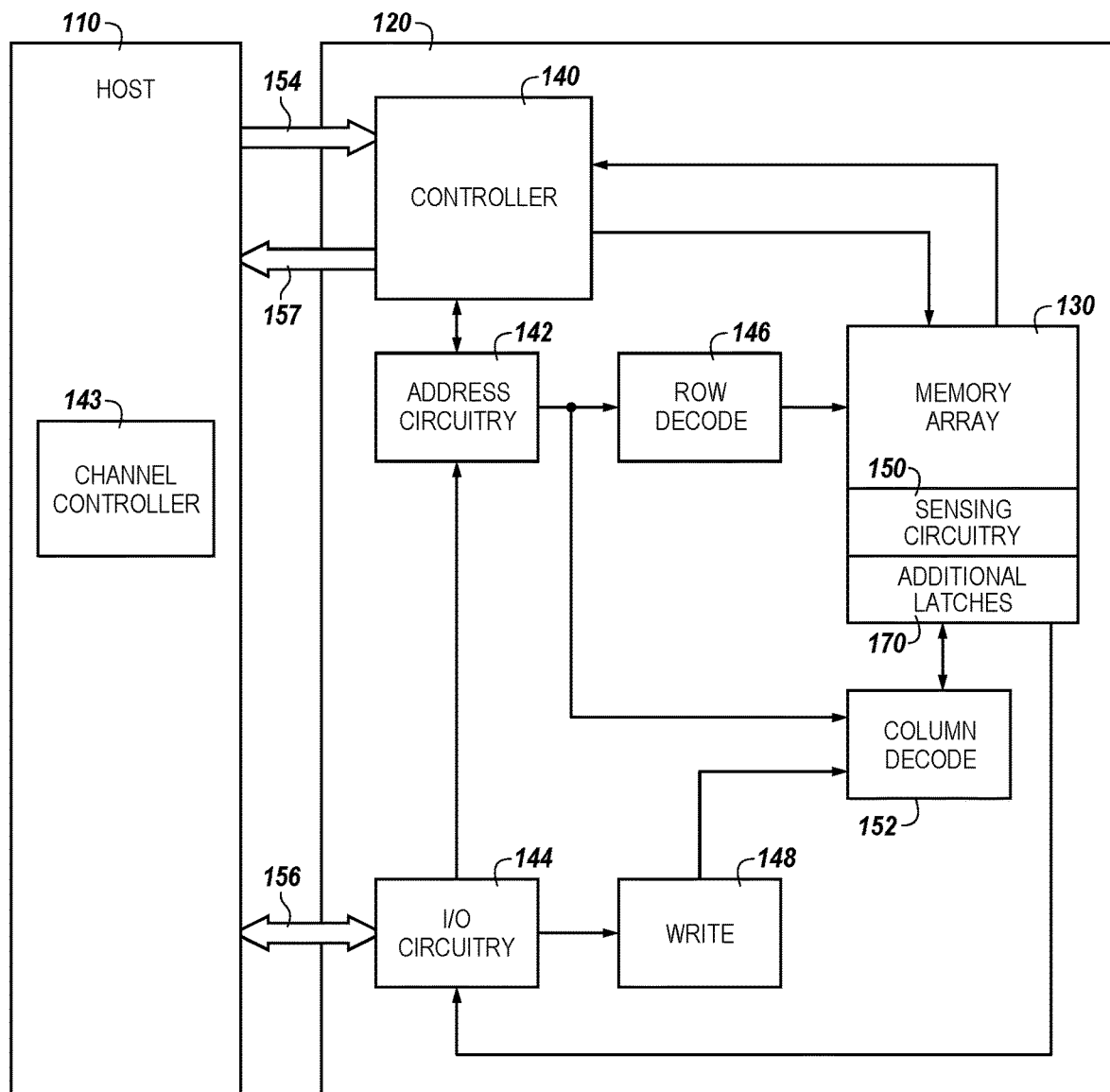
FIG. 1A is a block diagram of an apparatus in the form of an electronic system including a memory device in accordance with a number of embodiments of the present disclosure.

The present disclosure includes apparatuses and methods for operating neural networks. An example apparatus includes a plurality of neural networks, wherein the plurality of neural networks are configured to receive a particular portion of data and wherein each of the plurality of neural networks are configured to operate on the particular portion of data during a particular time period to make a determination regarding a characteristic of the particular portion of data. In some embodiments the plurality of neural networks may include processing in memory (PIM) architecture.

The present disclosure describes using independent neural networks to classify data. In a number of embodiments, a plurality of neural networks can be operated simultaneously on a particular portion of data. The particular portion of data can be an image, portion of an image, sound, or emotion. Each neural network can be trained independently as opposed to one large network being trained. This can provide better accuracy because each independent neural network can return similar or disparate results.

In a number of embodiments, the plurality of neural networks can include PIM architecture. As such, the plurality of neural networks can operate in a fixed point or binary weighted network on a PIM device and the plurality of neural networks can be single-bit networks. Previous approaches used a single 32-bit network to perform neural network functions.

In a number of embodiments, the plurality of neural networks can receive a particular portion of data and a controller coupled to the plurality of neural networks can weigh an accuracy of data recognition based on results of the plurality of neural networks. In a number of embodiments, the controller uses a voting scheme to weigh the accuracy of the data recognition. The controller can receive a vote from each of the plurality of neural networks and the vote can be weighted based on the particular training of each of the plurality of neural networks.

In a number of embodiments, the plurality of neural networks can include an array of memory cells coupled to sensing circuitry including a sense amplifier and a compute component, the sensing circuitry to make the determination regarding the characteristic of the particular portion of data. In a number of embodiments, the plurality of neural networks include an array of memory cells coupled to sensing circuitry via a plurality of input/output (I/O) lines shared as a data path for in data path compute operations associated with the array to make the determination regarding the characteristic of the particular portion of data.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

As described herein, the plurality of shared I/O lines 155 can be selectably shared by a plurality of subarrays, bank sections, quadrants, rows, and/or particular columns of memory cells via select logic coupled to each array. For example, the sensing circuitry 150 and/or additional latches 170, including a sense amplifier and select logic for each of a selectable subset of a number of columns (e.g., eight (8), sixteen (16), etc., column subsets of a total number of columns) can be selectably coupled to each of the plurality of shared I/O lines 155 for data values to be moved to the plurality of compute components 131-1, . . . , 131-M and/or logic stripes 124-1, . . . , 124-N in a compute unit in a data path of the plurality of shared I/O lines. In some embodiments, the plurality of compute components 131-1, . . . , 131-M selectably coupled to each of the plurality of shared I/O lines 155 can correspond to the number of columns selectably coupled to the plurality of shared I/O lines, e.g., 2K, 1K, etc. Because the singular forms "a", "an", and "the" can include both singular and plural referents herein, "a shared I/O line" can be used to refer to "a complementary pair of shared I/O lines", unless the context clearly dictates otherwise. Moreover, "shared I/O lines" is an abbreviation of "plurality of shared I/O lines".

The figures herein follow a numbering convention in which the first digit or digits correspond to the figure number and the remaining digits identify an element or component in the figure. Similar elements or components between different figures may be identified by the use of similar digits. For example, 108 may reference element "08" in FIG. 1A, and a similar element may be referenced as 208 in FIG. 2. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1A is a block diagram of an apparatus in the form of a computing system 100 including a memory device 120 which includes a memory array 130 in accordance with a number of embodiments of the present disclosure. As used herein, a memory device 120, controller 140, memory array 130, sensing circuitry 150, and/or a number of additional latches 170 might also be separately considered an "apparatus."

Figure 1B:
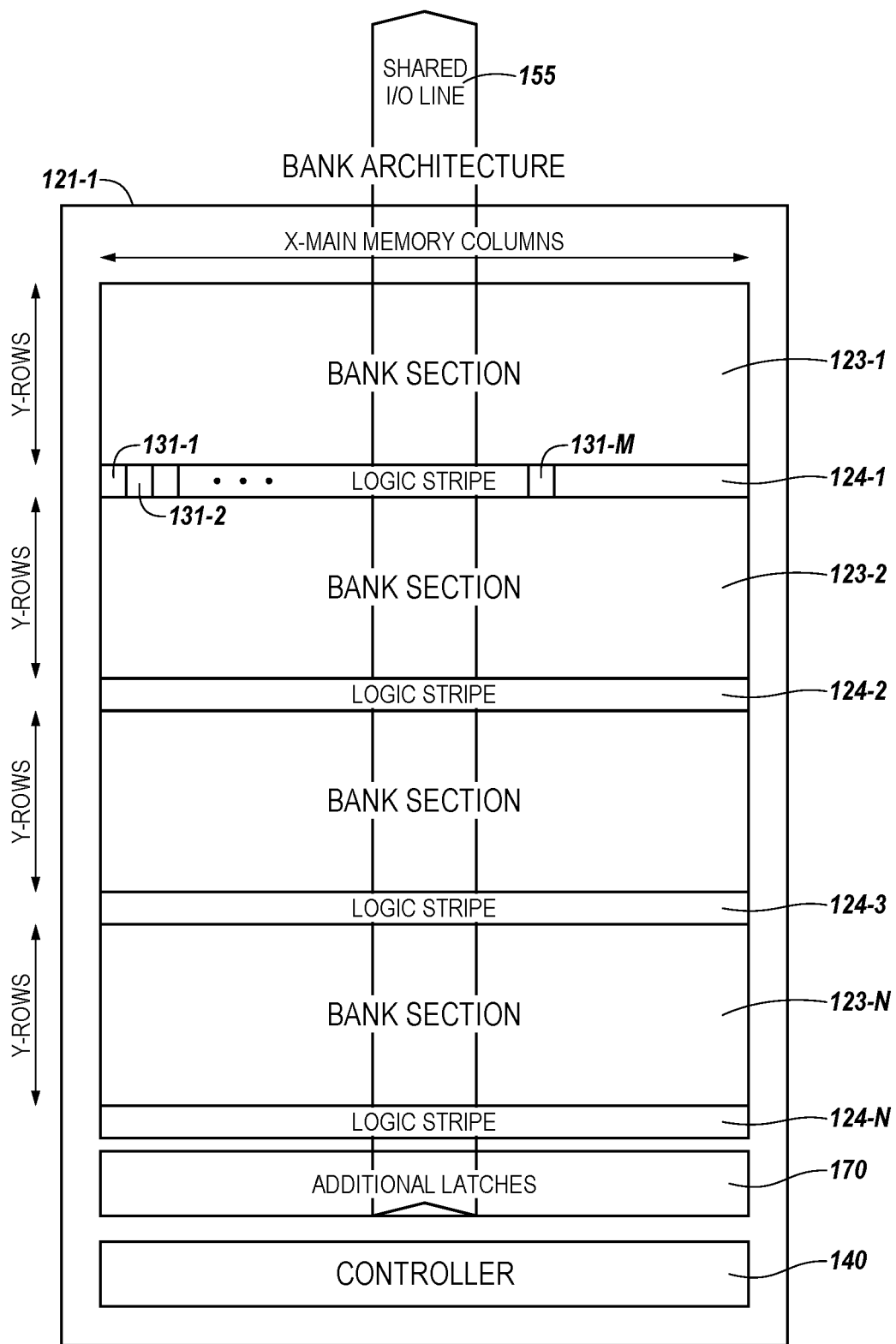
FIG. 1B is another block diagram of an apparatus in the form of an electronic system including a memory device having a shared input/out (I/O) line in a data path local to bank sections of an array in accordance with a number of embodiments of the present disclosure.

As used herein, the additional latches are intended to mean additional functionalities (e.g., amplifiers, select logic) that sense, couple, and/or move (e.g., read, store, cache) data values of memory cells in an array and that are distinct from the plurality of compute components 131-1, . . . , 131-M and/or logic stripes 124-1, . . . , 124-N in a compute unit in a data path of the plurality of shared I/O lines 155 shown in FIGS. 1B, 3-4 and 6-7. The logic stripes 124-1, . . . , 124-N in a data path of a plurality of shared input/output (I/O) lines 155 local to the array, as shown in FIG. 1B, may be associated with various bank sections 123-1, . . . , 123-N of memory cells in the bank 121-1. The bank 121-1 may be one of a plurality of banks on the memory device 120.

System 100 in FIG. 1A includes a host 110 coupled (e.g., connected) to the memory device 120. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the examples shown in FIG. 1A illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, among other types of arrays. The array 130 can include memory cells arranged in rows coupled by access lines (which may be referred to herein as word lines or select lines) and columns coupled by sense lines (which may be referred to herein as data lines or digit lines). Although a single array 130 is shown in FIG. 1A, embodiments are not so limited. For instance, memory device 120 may include a number of arrays 130 (e.g., a number of banks of DRAM cells, NAND flash cells, etc.).

The memory device 120 can include address circuitry 142 to latch address signals provided over a data bus 156 (e.g., an I/O bus connected to the host 110) by I/O circuitry 144 (e.g., provided to external ALU circuitry and/or to DRAM DQs via local I/O lines and global I/O lines). As used herein, DRAM DQs can enable input of data to and/or output of data from a bank (e.g., from and/or to the controller 140 and/or host 110) via a bus (e.g., data bus 156). During a write operation, a voltage (high=1, low=0) can be applied to a DQ (e.g., a pin). This voltage can be translated into an appropriate signal and stored in a selected memory cell. During a read operation, a data value read from a selected memory cell can appear at the DQ once access is complete and the output is enabled (e.g., by the output enable signal being low). At other times, DQs can be in a high impedance state, such that the DQs do not source or sink current and do not present a signal to the system. This also may reduce DQ contention when two or more devices (e.g., banks) share a combined data bus, as described herein. Such DQs are separate and distinct from the plurality of shared I/O lines 155 (in FIG. 1B) in a data path local to the array 130.

Status and exception information can be provided from the controller 140 of the memory device 120 to a channel controller 143, for example, through an out-of-band (OOB) bus 157, e.g., high-speed interface (HSI), which in turn can be provided from the channel controller 143 to the host 110. The channel controller 143 can include a logic component to allocate a plurality of locations (e.g., controllers for subarrays) in the arrays of each respective bank to store bank commands, application instructions (e.g., for sequences of operations), and arguments (PIM commands) for various banks associated with operations for each of a plurality of memory devices 120. The channel controller 143 can dispatch commands (e.g., PIM commands) to the plurality of memory devices 120 to store those program instructions within a given bank 121 (FIG. 1B) of a memory device 120.

Address signals are received through address circuitry 142 and decoded by a row decoder 146 and a column decoder 152 to access the memory array 130. Data can be sensed (read) from memory array 130 by sensing voltage and/or current changes on sense lines (digit lines) using a number of sense amplifiers, as described herein, of the sensing circuitry 150. A sense amplifier can read and latch a page (e.g., a row) of data from the memory array 130. Additional compute circuitry, as described herein, can be coupled to the sensing circuitry 150 and can be used in combination with the sense amplifiers to sense, store (e.g., cache and/or buffer), perform compute functions (e.g., operations), and/or move data. The I/O circuitry 144 can be used for bi-directional data communication with host 110 over the data bus 156 (e.g., a 64 bit wide data bus). The write circuitry 148 can be used to write data to the memory array 130.

Figure 5:
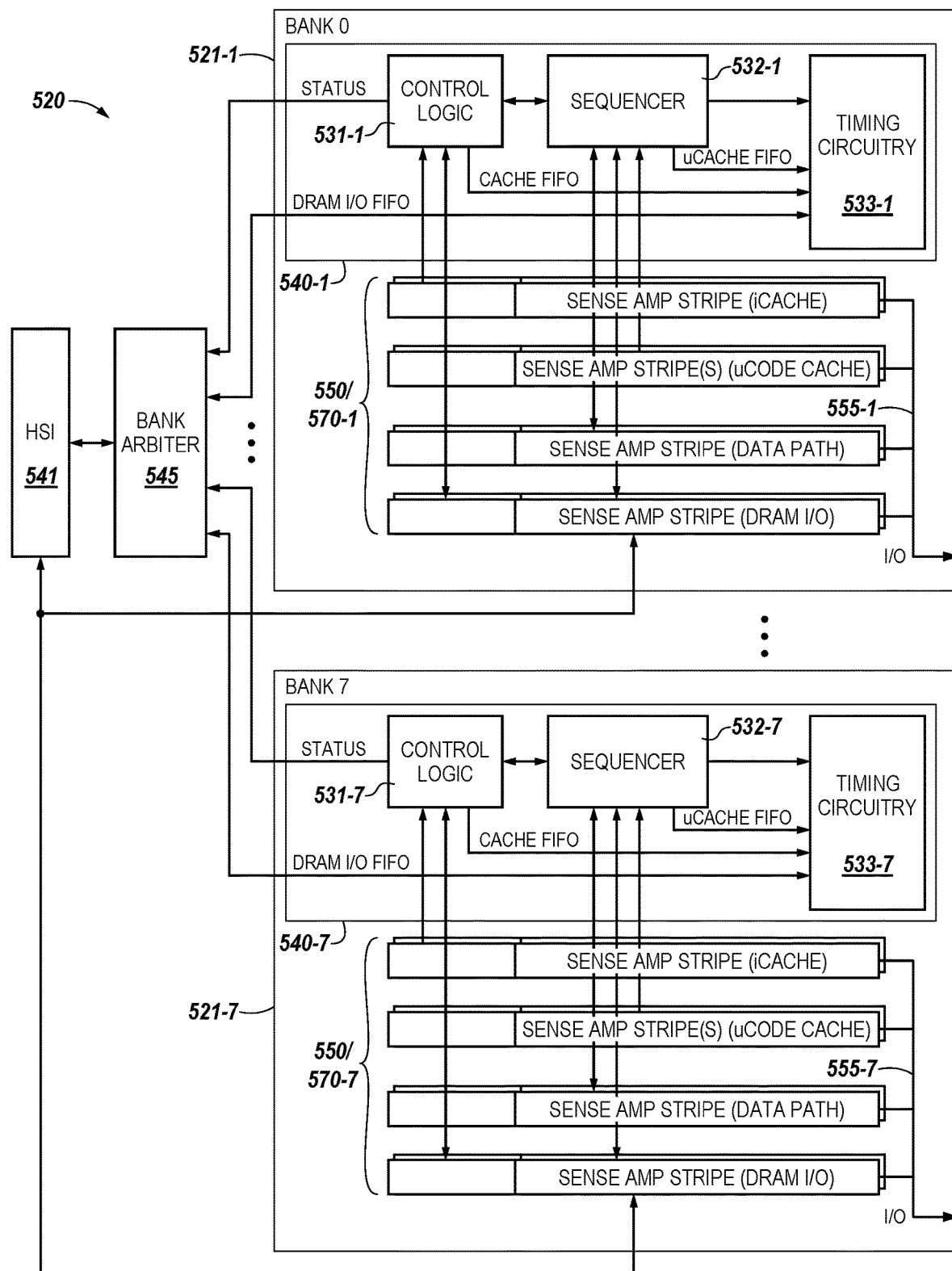
FIG. 5 is a block diagram illustrating an example of a controller to a memory device in accordance with a number of embodiments of the present disclosure.

Controller 140 (e.g., bank control logic, sequencer and timing circuitry shown in FIG. 5) can decode signals (e.g., commands) provided by control bus 154 from the host 110. These signals can include chip enable signals, write enable signals, and/or address latch signals that can be used to control operations performed on the memory array 130, including data sense, data store, data movement (e.g., copying, transferring, and/or transporting data values), data write, and/or data erase operations, among other operations. In various embodiments, the controller 140 can be responsible for executing instructions from the host 110 and accessing the memory array 130. The controller 140 can be a state machine, a sequencer, or some other type of controller. The controller 140 can control shifting data (e.g., right or left) in a row of an array (e.g., memory array 130) and execute microcode instructions to perform operations such as compute operations, e.g., AND, OR, NOR, XOR, add, subtract, multiply, divide, etc.

Examples of the sensing circuitry 150 are described further below (e.g., in FIGS. 3 and 4). For instance, in some embodiments, the sensing circuitry 150 can include a number of sense amplifiers and a number of compute components, which may serve as an accumulator and can be used to perform operations in each subarray (e.g., on data associated with complementary sense lines).

In some embodiments, the sensing circuitry 150 can be used to perform operations using data stored in memory array 130 as inputs and participate in movement of the data for copy, transfer, transport, writing, logic, and/or storage operations to a different location in the memory array 130 without transferring the data via a sense line address access (e.g., without firing a column decode signal). As such, various compute functions can be performed using, and within, sensing circuitry 150 rather than (or in association with) being performed by processing resources external to the sensing circuitry 150 (e.g., by a processor associated with host 110 and/or other processing circuitry, such as ALU circuitry, located on device 120, such as on controller 140 or elsewhere). However, in addition, embodiments according to the present disclosure perform compute functions on data values moved to a plurality of compute components 131-1, . . . , 131-M and/or logic stripes 124-1, . . . , 124-N in a compute unit from the rows of the array. And as an example, according to embodiments, compute operations may be controlled in the compute unit at speeds of 2 nanoseconds (ns) without having to move the data values back into the rows, as compared to an example time required to fire the rows in the array of 60 nanoseconds (ns).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O circuitry 144.

In contrast, embodiments according to the present disclosure perform compute functions on data values, moved to a plurality of compute components 131-1, . . . , 131-M and/or logic stripes 124-1, . . . , 124-N via a plurality of shared I/O lines 155 from the rows of the array, in a compute unit in a data path local to the array. Additionally, sensing circuitry 150 may be configured to perform operations on data stored in memory array 130 and store the result back to the memory array 130 without enabling an I/O line (e.g., a local I/O line) coupled to the sensing circuitry 150. However, once loaded, compute operations may be controlled in the compute unit much faster, e.g., at speeds of 2 nanoseconds (ns), without having to move the data values back into the rows, as compared to an example time required to fire the rows in the array, e.g., 60 nanoseconds (ns). The sensing circuitry 150 can be formed on pitch with the memory cells of the array. The plurality of compute components 131-1, . . . , 131-M and/or logic stripes 124-1, . . . , 124-N, associated with the data path of the plurality of shared I/O lines 155, have a pitch equal to that of the data path and that is a function of a pitch of digit lines to the array of memory cells. For example, the compute component has a pitch that is an integer multiple of the pitch of digit lines to the array of memory cells.

For example, the sensing circuitry 150 described herein can be formed on a same pitch as a pair of complementary sense lines (e.g., digit lines). As an example, a pair of complementary memory cells may have a cell size with a $6F^2$ pitch (e.g., 3F×2F), where F is a feature size. If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines. Likewise, the compute components 131-1, . . . , 131-M and/or logic stripes 124-1, . . . , 124-N, associated with the data path of the plurality of shared I/O lines 155, have a pitch that is a function of the 3F pitch of the complementary sense lines. For example, the compute components 131-1, . . . , 131-M and/or logic stripes 124-1, . . . , 124-N will have a pitch that is an integer multiple of the 3F pitch of digit lines to the array of memory cells.

By contrast, the circuitry of the processing resource(s) (e.g., a compute engine, such as an ALU) of various prior systems may not conform to pitch rules associated with a memory array. For example, the memory cells of a memory array may have a $4F^2$ or $6F^2$ cell size. As such, the devices (e.g., logic gates) associated with ALU circuitry of previous systems may not be capable of being formed on pitch with the memory cells (e.g., on a same pitch as the sense lines), which can affect chip size and/or memory density, for example. In the context of some computing systems and subsystems (e.g., a central processing unit (CPU)), data may be processed in a location that is not on pitch and/or on chip with memory (e.g., memory cells in the array), as described herein. For example, the data may be processed by a processing resource associated with a host, for instance, rather than on pitch with the memory.

As such, in a number of embodiments, circuitry external to array 130 and sensing circuitry 150 is not needed to perform compute functions as the sensing circuitry 150 can perform the appropriate operations to perform such compute functions or can perform such operations in a data path of a plurality of shared I/O lines local to the array without the use of an external processing resource. Therefore, the sensing circuitry 150 and/or the plurality of compute components 131-1, . . . , 131-M and/or logic stripes 124-1, . . . , 124-N in a compute unit in a data path of the plurality of shared I/O lines 155 may be used to complement or to replace, at least to some extent, such an external processing resource (or at least the bandwidth consumption of such an external processing resource). In some embodiments, the sensing circuitry 150 and/or the plurality of compute components 131-1, . . . , 131-M and/or logic stripes 124-1, . . . , 124-N in a compute unit in a data path of the plurality of shared I/O lines 155 may be used to perform operations (e.g., to execute instructions) in addition to operations performed by an external processing resource (e.g., host 110). For instance, host 110 and/or sensing circuitry 150 may be limited to performing only certain operations and/or a certain number of operations.

Operations described herein can include operations associated with a processing in memory (PIM) capable device. PIM capable device operations can use bit vector based operations. As used herein, the term "bit vector" is intended to mean a physically contiguous number of bits on a bit vector memory device (e.g., a PIM device) stored physically contiguous in a row of an array of memory cells. Thus, as used herein a "bit vector operation" is intended to mean an operation that is performed on a bit vector that is a contiguous portion of virtual address space (e.g., used by a PIM device). For example, a row of virtual address space in the PIM device may have a bit length of 16K bits (e.g., corresponding to 16K complementary pairs of memory cells in a DRAM configuration). Sensing circuitry 150, as described herein, for such a 16K bit row may include a corresponding 16K processing elements (e.g., compute components, as described herein) formed on pitch with the sense lines selectably coupled to corresponding memory cells in the 16 bit row. A compute component in the PIM device may operate as a one bit processing element (PE) on a single bit of the bit vector of the row of memory cells sensed by the sensing circuitry 150 (e.g., sensed by and/or stored in a sense amplifier paired with the compute component, as described herein). Similarly, the plurality of compute components 131-1, . . . , 131-M and/or logic stripes 124-1, . . . , 124-N in a compute unit in a data path of the plurality of shared I/O lines 155 may operate as a one bit processing element (PE) on a single bit of the bit vector of the row of memory cells sensed in an array.

Enabling an I/O line can include enabling (e.g., turning on, activating) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform operations without enabling column decode lines of the array.

However, the plurality of shared I/O lines 155 may be enabled in order to load data values to the plurality of compute components 131-1, . . . , 131-M and/or logic stripes 124-1, . . . , 124-N in a compute unit in a data path of the plurality of shared I/O lines 155 where compute operations may be controlled much faster. For example, in the plurality of compute components 131-1, . . . , 131-M and/or logic stripes 124-1, . . . , 124-N in the compute unit, the compute operation may be performed at speeds of 2 nanoseconds (ns). This enhancement of speed can be attributed to not having to move the data values back into the rows with the associated time used in firing the rows in the array, e.g., 60 nanoseconds (ns).

FIG. 1B is a block diagram of a bank 121-1 of a memory device in accordance with a number of embodiments of the present disclosure. For example, bank 121-1 can represent an example bank of a memory device 120. As shown in FIG. 1B, a bank 121-1 can include a plurality of main memory columns (shown horizontally as X) (e.g., 16,384 columns in an example DRAM bank). Additionally, the bank 121-1 may be divided up into bank sections (e.g., quadrants of 32 subarrays), 123-1, 123-2, . . . , 123-N. Each bank section may be associated with a plurality of compute components 131-1, . . . , 131-M in logic stripes 124-1, . . . , 124-N in a compute unit in a data path of the plurality of shared I/O lines 155. Each of the of the bank sections 123-1, . . . , 123-N can include a plurality of rows (shown vertically as Y) (e.g., each section may be a quadrant that includes 32 subarrays that each may include 512 rows in an example DRAM bank). Example embodiments are not limited to the example horizontal and/or vertical orientation of columns and rows described here or the example numbers thereof.

As shown in FIG. 1B, the bank 121-1 can be divided into a plurality of bank sections 123-1, . . . , 123-N. Each bank sections can have a plurality of compute components 131-1, . . . , 131-M and logic stripes 124-1, . . . , 124-N in a compute unit in a data path of the plurality of shared I/O lines 155 associated therewith. The bank 121-1 can include a controller 140 to direct operations on data values loaded to the plurality of compute components 131-1, . . . , 131-M in logic stripes 124-1, . . . , 124-N in a compute unit in a data path of the plurality of shared I/O lines 155.

Figure 2:
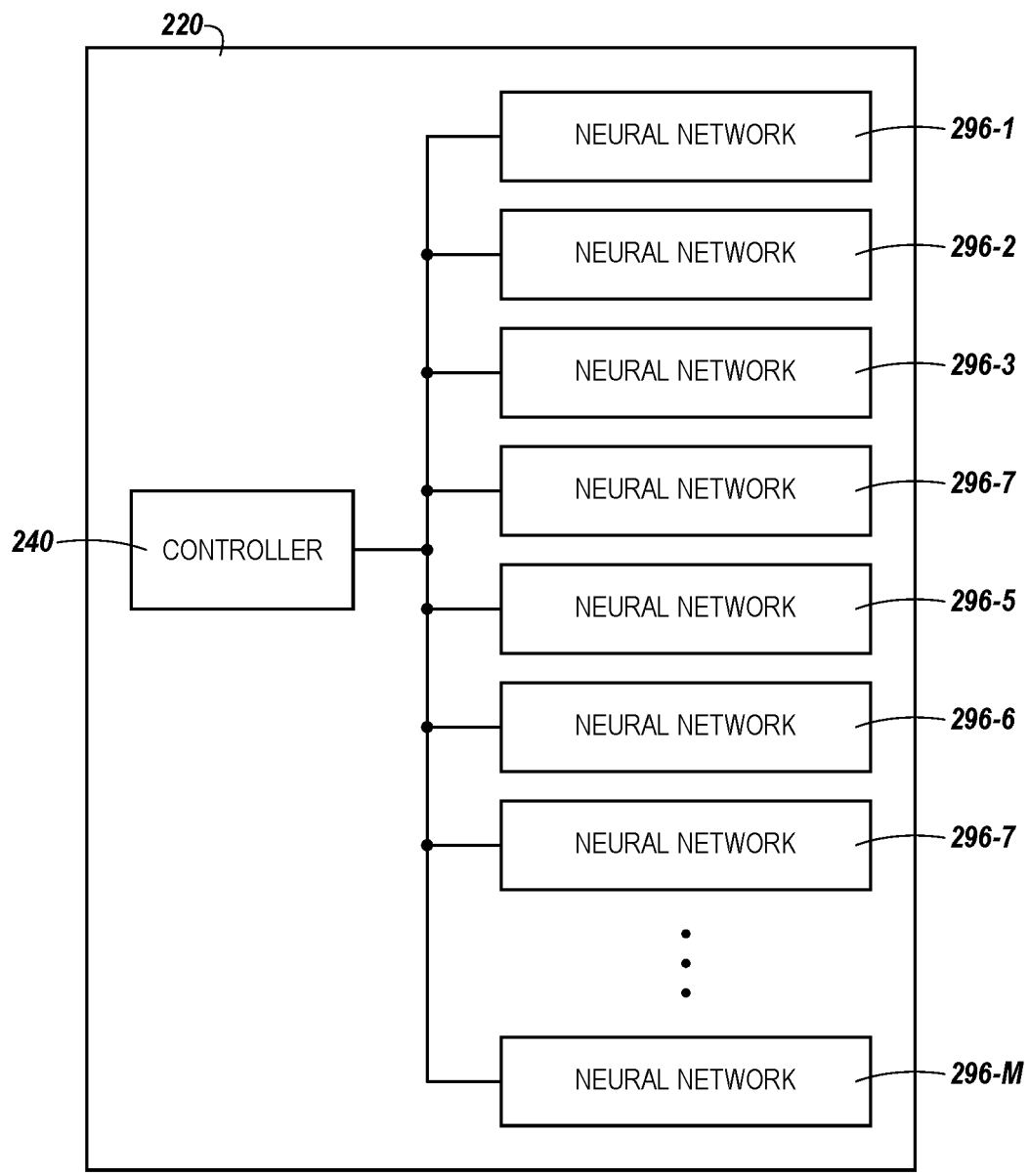
FIG. 2 is a schematic diagram illustrating neural networks in accordance with a number of embodiments of the present disclosure.

FIG. 2 is a schematic diagram illustrating neural networks in accordance with a number of embodiments of the present disclosure. Controller 240 can correspond to controller 140 shown in FIG. 1A.

As shown in the example embodiment of FIG. 2, a plurality of neural networks 296-1, . . . , 296-M in a memory device 220 can receive a particular portion of data and a controller 240 coupled to the plurality of neural networks 296-1, . . . , 296-M can weigh an accuracy of data recognition based on results of the plurality of neural networks 296-1, . . . , 296-M. In a number of embodiments the plurality of neural networks 296-1, . . . , 296-M can simultaneously receive instructions to operate on the particular portion of data.

In a number of embodiments, the controller 240 uses a voting scheme to weigh the accuracy of the data recognition. The controller 240 can receive a vote from each of the plurality of neural networks 296-1, . . . , 296-M. The vote from each of the plurality of neural networks 296-1, . . . , 296-M can be weighted by the controller 240. The vote from each of the plurality of neural networks 296-1, . . . , 296-M can be weighted based on particular training of each of the plurality of neural networks 296-1, . . . , 296-M. The particular training of each of the plurality of neural networks 296-1, . . . , 296-M for image data, for example, can include data recognition of blurry images, low-light images, images of people, images of cats, images of license plates, etc. If one of the plurality of neural networks 296-1, . . . , 296-M is trained to be accurate with identifying dogs and less accurate in identifying cats and votes that the image is showing a cat and a second of the plurality of neural networks 296-1, . . . , 296-M is trained to be accurate with cats and votes that the image is showing a mouse the controller can weigh the votes based on the particular training of each of the plurality of neural networks 296-1, . . . , 296-M and provide an output. The controller in this case would not weigh in favor of a cat because the first of the plurality of neural networks 296-1, . . . , 296-M was trained to be accurate in identifying dogs and identified a cat and the second of the plurality of neural networks 296-1, . . . , 296-M was trained to be accurate in identifying cats and did not identify a cat. The voting scheme can be a majority rule where the majority of the plurality of neural networks 296-1, . . . , 296-M agree on a result. The voting scheme can be an average where the result of each neural network is averaged. Alternatively, an output can be discarded if there is no uniform decision on the result among the plurality of neural networks 296-1, . . . , 296-M. Under this voting scheme, each of the plurality of neural networks 296-1, . . . , 296-M must vote the same result for the controller 240 to provide an output.

In a number of embodiments, the plurality of neural networks 296-1, . . . , 296-M receive a portion of data, determine a characteristic of the particular portion of data, and determine a training confidence factor of the characteristic. The plurality of neural networks 296-1, . . . , 296-M can determine the training confidence factor of the characteristic based on training of each of the plurality of neural networks. A controller 240 coupled to the plurality of neural networks 296-1, . . . , 296-M can weigh an accuracy of data recognition based on the training confidence factor of each of the plurality of neural networks. The controller 240 can determine a characteristic of the particular portion of data based on the accuracy of data recognition.

In a number of embodiments, each of the plurality of neural networks 296-1, . . . , 296-M can be 128 megabytes (MB) or less. Additionally, the plurality of neural networks 296-1, . . . , 296-M can be trained offline.

Figure 3:
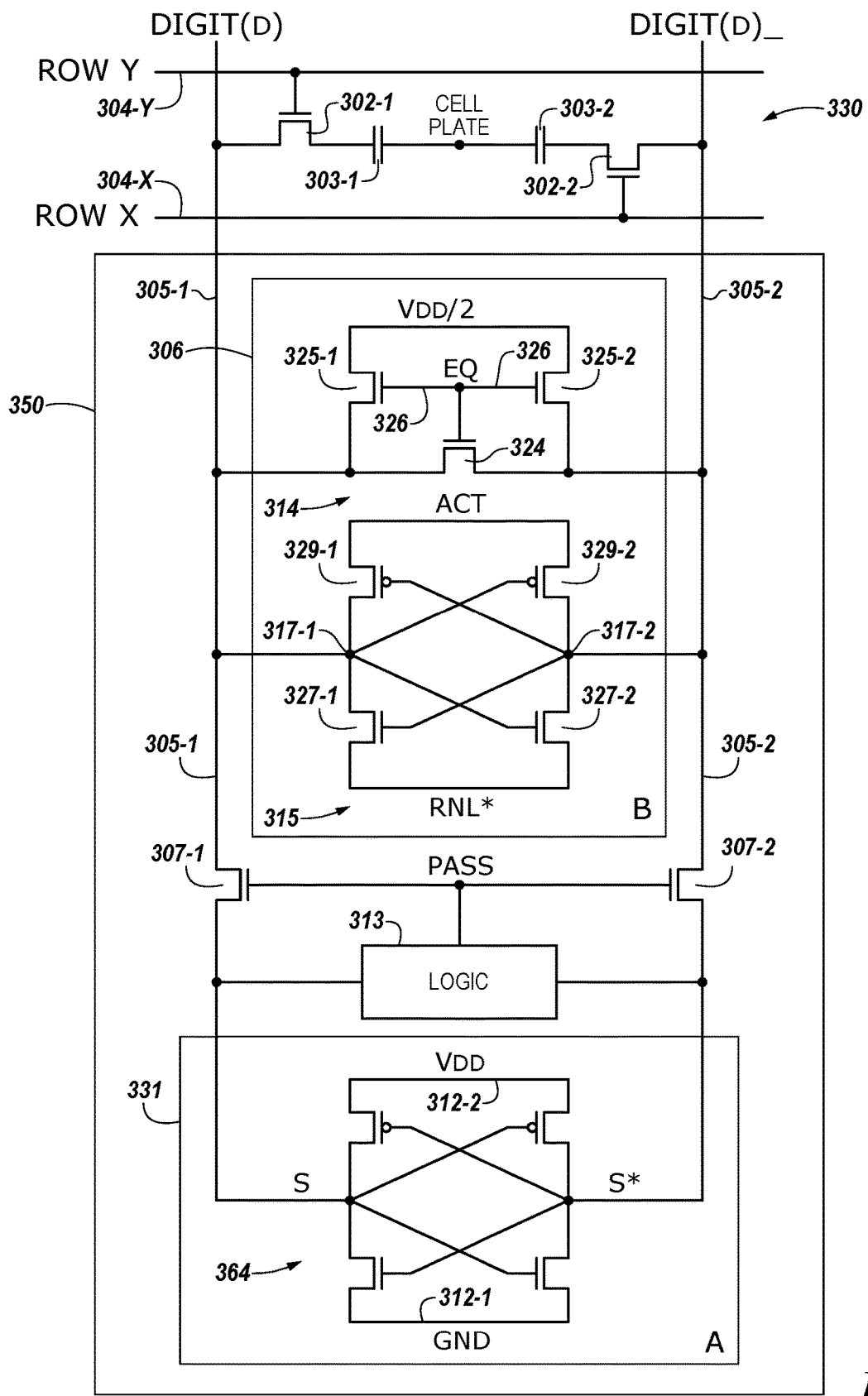
FIG. 3 is a schematic diagram illustrating sensing circuitry of a memory device, the sensing circuitry including a compute component, in accordance with a number of embodiments of the present disclosure.

FIG. 3 is a schematic diagram illustrating sensing circuitry 350 in accordance with a number of embodiments of the present disclosure. The sensing circuitry 350 can correspond to sensing circuitry 150 shown in FIG. 1A.

As shown in the example embodiment of FIG. 3, a memory cell can include a storage element (e.g., capacitor) and an access device (e.g., transistor). For example, a first memory cell can include transistor 302-1 and capacitor 303-1, and a second memory cell can include transistor 302-2 and capacitor 303-2, etc. In this embodiment, the memory array 330 is a DRAM array of 1T1B (one transistor one capacitor) memory cells, although other embodiments of configurations can be used (e.g., 2T2C with two transistors and two capacitors per memory cell). In a number of embodiments, the memory cells may be destructive read memory cells (e.g., reading the data stored in the cell destroys the data such that the data originally stored in the cell is refreshed after being read).

The cells of the memory array 330 can be arranged in rows coupled by access (word) lines 304-X (Row X), 304-Y (Row Y), etc., and columns coupled by pairs of complementary sense lines (e.g., digit lines DIGIT(D) and DIGIT (D)_ shown in FIG. 3). The individual sense lines corresponding to each pair of complementary sense lines can also be referred to as digit lines 305-1 for DIGIT (D) and 305-2 for DIGIT (D)_, respectively, or corresponding reference numbers in FIG. 4. Although only one pair of complementary digit lines are shown in FIG. 3, embodiments of the present disclosure are not so limited, and an array of memory cells can include additional columns of memory cells and digit lines (e.g., 4,096, 8,192, 16,384, etc.).

Although rows and columns are illustrated as orthogonally oriented in a plane, embodiments are not so limited. For example, the rows and columns may be oriented relative to each other in any feasible three-dimensional configuration. For example, the rows and columns may be oriented at any angle relative to each other, may be oriented in a substantially horizontal plane or a substantially vertical plane, and/or may be oriented in a folded topology, among other possible three-dimensional configurations.

Memory cells can be coupled to different digit lines and word lines. For example, a first source/drain region of a transistor 302-1 can be coupled to digit line 305-1 (D), a second source/drain region of transistor 302-1 can be coupled to capacitor 303-1, and a gate of a transistor 302-1 can be coupled to word line 304-Y. A first source/drain region of a transistor 302-2 can be coupled to digit line 305-2 (D)_, a second source/drain region of transistor 302-2 can be coupled to capacitor 303-2, and a gate of a transistor 302-2 can be coupled to word line 304-X. A cell plate, as shown in FIG. 3, can be coupled to each of capacitors 303-1 and 303-2. The cell plate can be a common node to which a reference voltage (e.g., ground) can be applied in various memory array configurations.

The memory array 330 is configured to couple to sensing circuitry 350 in accordance with a number of embodiments of the present disclosure. In this embodiment, the sensing circuitry 350 comprises a sense amplifier 306 and a compute component 331 corresponding to respective columns of memory cells (e.g., coupled to respective pairs of complementary digit lines). The sense amplifier 306 can be coupled to the pair of complementary digit lines 305-1 and 305-2. The compute component 331 can be coupled to the sense amplifier 306 via pass gates 307-1 and 307-2. The gates of the pass gates 307-1 and 307-2 can be coupled to operation selection logic 313.

The operation selection logic 313 can be configured to include pass gate logic for controlling pass gates that couple the pair of complementary digit lines un-transposed between the sense amplifier 306 and the compute component 331 and swap gate logic for controlling swap gates that couple the pair of complementary digit lines transposed between the sense amplifier 306 and the compute component 331. The operation selection logic 313 can also be coupled to the pair of complementary digit lines 305-1 and 305-2. The operation selection logic 313 can be configured to control continuity of pass gates 307-1 and 307-2 based on a selected operation.

The sense amplifier 306 can be operated to determine a data value (e.g., logic state) stored in a selected memory cell. The sense amplifier 306 can comprise a cross coupled latch, which can be referred to herein as a primary latch. In the example illustrated in FIG. 3, the circuitry corresponding to sense amplifier 306 comprises a latch 315 including four transistors coupled to a pair of complementary digit lines D 305-1 and (D)_ 305-2. However, embodiments are not limited to this example. The latch 315 can be a cross coupled latch (e.g., gates of a pair of transistors) such as n-channel transistors (e.g., NMOS transistors) 327-1 and 327-2 are cross coupled with the gates of another pair of transistors, such as p-channel transistors (e.g., PMOS transistors) 329-1 and 329-2). The cross coupled latch 315 comprising transistors 327-1, 327-2, 329-1, and 329-2 can be referred to as the primary latch.

In operation, when a memory cell is being sensed (e.g., read), the voltage on one of the digit lines 305-1 (D) or 305-2 (D)_ will be slightly greater than the voltage on the other one of digit lines 305-1 (D) or 305-2 (D)_. An ACT signal and an RNL* signal can be driven low to enable (e.g., fire) the sense amplifier 306. The digit lines 305-1 (D) or 305-2 (D)_ having the lower voltage will turn on one of the PMOS transistor 329-1 or 329-2 to a greater extent than the other of PMOS transistor 329-1 or 329-2, thereby driving high the digit line 305-1 (D) or 305-2 (D)_ having the higher voltage to a greater extent than the other digit line 305-1 (D) or 305-2 (D)_ is driven high.

Similarly, the digit line 305-1 (D) or 305-2 (D)_ having the higher voltage will turn on one of the NMOS transistor 327-1 or 327-2 to a greater extent than the other of the NMOS transistor 327-1 or 327-2, thereby driving low the digit line 305-1 (D) or 305-2 (D)_ having the lower voltage to a greater extent than the other digit line 305-1 (D) or 305-2 (D)_ is driven low. As a result, after a short delay, the digit line 305-1 (D) or 305-2 (D)_ having the slightly greater voltage is driven to the voltage of the supply voltage $V_{CC}$ through a source transistor, and the other digit line 305-1 (D) or 305-2 (D)_ is driven to the voltage of the reference voltage (e.g., ground) through a sink transistor. Therefore, the cross coupled NMOS transistors 327-1 and 327-2 and PMOS transistors 329-1 and 329-2 serve as a sense amplifier pair, which amplify the differential voltage on the digit lines 305-1 (D) and 305-2 (D)_ and operate to latch a data value sensed from the selected memory cell.

Embodiments are not limited to the sense amplifier 306 configuration illustrated in FIG. 3. As an example, the sense amplifier 306 can be a current-mode sense amplifier and a single-ended sense amplifier (e.g., sense amplifier coupled to one digit line). Also, embodiments of the present disclosure are not limited to a folded digit line architecture such as that shown in FIG. 3.

The sense amplifier 306 can, in conjunction with the compute component 331, be operated to perform various operations using data from an array as input. In a number of embodiments, the result of an operation can be stored back to the array without transferring the data via a digit line address access (e.g., without firing a column decode signal such that data is transferred to circuitry external from the array and sensing circuitry via local I/O lines). As such, a number of embodiments of the present disclosure can enable performing operations and compute functions associated therewith using less power than various previous approaches. Additionally, since a number of embodiments eliminate the need to transfer data across local and global I/O lines in order to perform compute functions (e.g., between memory and discrete processor), a number of embodiments can enable an increased (e.g., faster) processing capability as compared to previous approaches.

The sense amplifier 306 can further include equilibration circuitry 314, which can be configured to equilibrate the digit lines 305-1 (D) and 305-2 (D)_. In this example, the equilibration circuitry 314 comprises a transistor 324 coupled between digit lines 305-1 (D) and 305-2 (D)_. The equilibration circuitry 314 also comprises transistors 325-1 and 325-2 each having a first source/drain region coupled to an equilibration voltage (e.g., $V_{DD}/2$), where $V_{DD}$ is a supply voltage associated with the array. A second source/drain region of transistor 325-1 can be coupled digit line 305-1 (D), and a second source/drain region of transistor 325-2 can be coupled digit line 305-2 (D)_. Gates of transistors 324, 325-1, and 325-2 can be coupled together, and to an equilibration (EQ) control signal line 326. As such, activating EQ enables the transistors 324, 325-1, and 325-2, which effectively shorts digit lines 305-1 (D) and 305-2 (D)_ together and to the equilibration voltage (e.g., $V_{CC}/2$).

Although FIG. 3 shows sense amplifier 306 comprising the equilibration circuitry 314, embodiments are not so limited, and the equilibration circuitry 314 may be implemented discretely from the sense amplifier 306, implemented in a different configuration than that shown in FIG. 3, or not implemented at all.

As described further below, in a number of embodiments, the sensing circuitry 350 (e.g., sense amplifier 306 and compute component 331) can be operated to perform a selected operation and initially store the result in one of the sense amplifier 306 or the compute component 331 without transferring data from the sensing circuitry via a local or global I/O line (e.g., without performing a sense line address access via activation of a column decode signal, for instance).

Performance of operations (e.g., Boolean logical operations involving data values) is fundamental and commonly used. Boolean logical operations are used in many higher level operations. Consequently, speed and/or power efficiencies that can be realized with improved operations, can translate into speed and/or power efficiencies of higher order functionalities.

As shown in FIG. 3, the compute component 331 can also comprise a latch, which can be referred to herein as a secondary latch 364. The secondary latch 364 can be configured and operated in a manner similar to that described above with respect to the primary latch 315, with the exception that the pair of cross coupled p-channel transistors (e.g., PMOS transistors) included in the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component 331 is not limited to that shown in FIG. 2, and various other embodiments are feasible.

As described herein, a memory device (e.g., 120 in FIG. 1A) can be configured to couple to a host (e.g., 110) via a data bus (e.g., 156) and a control bus (e.g., 154). A bank 121 in the memory device 120 can include a plurality of bank sections (123-1, . . . , 123-N in FIG. 1B) of memory cells. The bank 121 can include sensing circuitry (e.g., 150 in FIG. 1A and corresponding reference numbers in FIGS. 3 and 4) coupled to the plurality of arrays via a plurality of columns (FIG. 1B) of the memory cells. The sensing circuitry can include a sense amplifier and a compute component (e.g., 306 and 331, respectively, in FIG. 3) coupled to each of the columns.

Each bank section 123 can be associated with a plurality of logic stripes (e.g., 124-0, 124-1, . . . , 124-N−1 in FIG. 1B) in a compute unit in a data path of a plurality of shared I/O lines (155 in FIG. 1B) local to array 330. A controller (e.g., 140 in FIGS. 1A-1B) coupled to the bank can be configured to direct, as described herein, movement of data values to a compute component in a logic stripe in a compute unit 460 (FIG. 4) in a data path of a shared I/O line 455 (FIG. 4) local to the array 330.

The memory device can include a logic stripe (e.g., 124 in FIG. 1B) having a plurality of compute components that can correspond to a number of the plurality of columns (FIG. 1B) of the memory cells. As discussed further in connection with FIG. 4, the number of sense amplifiers 306 and/or compute components 331 in sensing circuitry 350 can be selectably coupled (e.g., via column select circuitry 458-1 and 458-2 in FIG. 4) to a plurality of shared I/O lines 455 (FIG. 4). The column select circuitry can be configured to selectably sense data in a particular column of memory cells of an array by being selectably coupled to a plurality of (e.g., four, eight, and sixteen, among other possibilities) sense amplifiers and/or compute components.

In some embodiments, a number of a plurality of logic stripes (e.g., 124-1, . . . , 124-N in FIG. 1B) in a bank can correspond to a number of bank sections 123-1, . . . , 123-N in FIG. 1B (e.g., a quadrant having a plurality of subarrays) in the bank. A logic stripe can include a plurality of compute components in a data path of a shared I/O local to the array 330 that are like compute components 331 shown in FIG. 3. As will be shown in FIG. 4, data values sensed from a row of the array can be moved in parallel by column select logic via a plurality of shared I/O lines 455 (FIG. 4) to a plurality of compute components in a compute unit 460 (FIG. 4) a data path of the plurality of shared I/O lines 455 (FIG. 4). In some embodiments, the amount of data can correspond to at least a thousand bit width of the plurality of shared I/O lines.

As described herein, the array of memory cells can include an implementation of DRAM memory cells where the controller is configured, in response to a command, to move (e.g., copy, transfer, and/or transport) data from the source location to the destination location via a shared I/O line. In various embodiments, the source location can be in a first bank and the destination location can be in a compute unit 460 (FIG. 4) in a data path of the shared I/O lines 455 (FIG. 4) local to the array 330.

Figure 4:
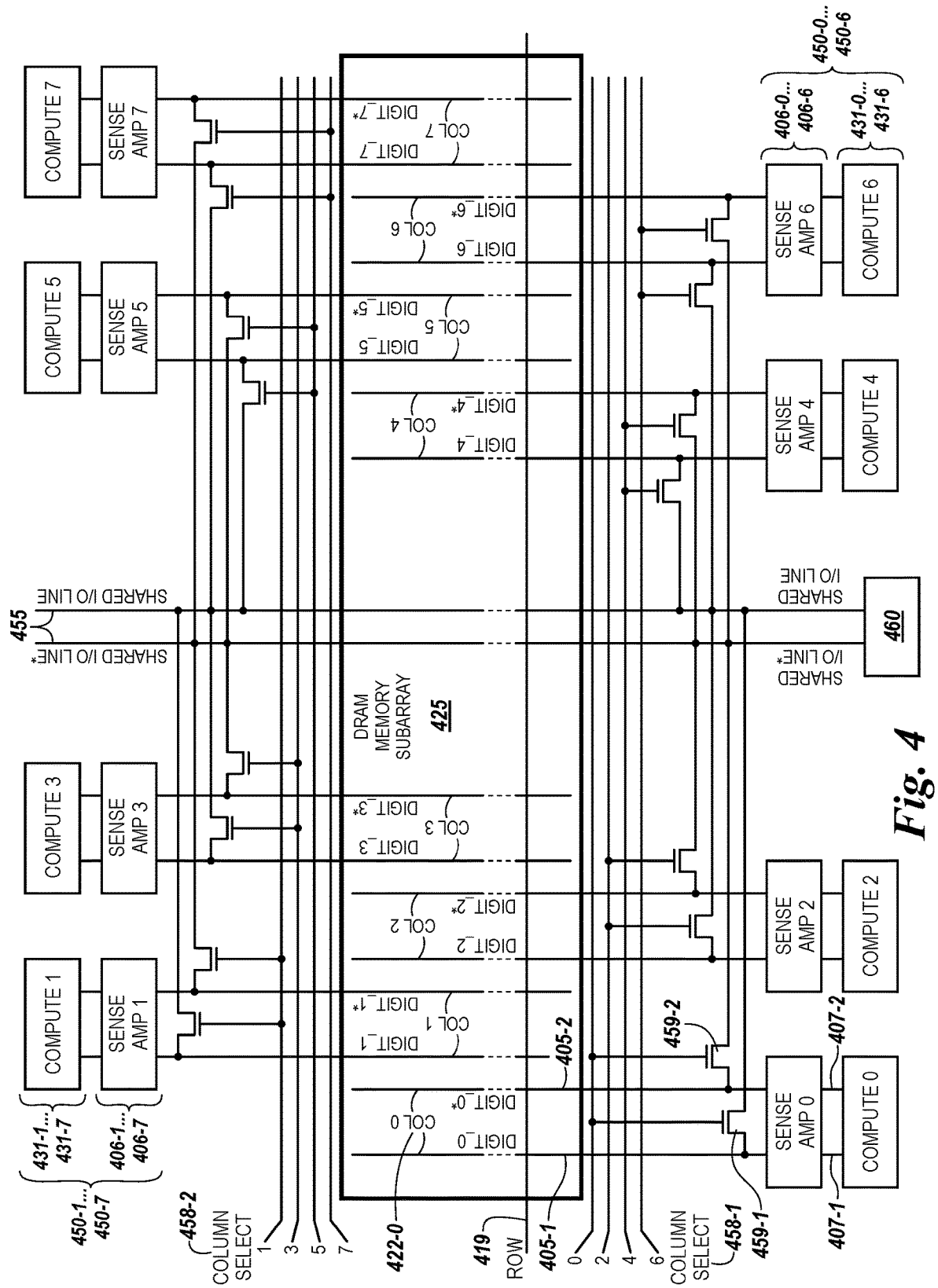
FIG. 4 is a schematic diagram illustrating circuitry for a plurality of shared I/O lines in a data path of an array in accordance with a number of embodiments of the present disclosure.

As described in FIG. 4, the apparatus can be configured to move (e.g., copy, transfer, and/or transport) data from a source location, including a particular row (e.g., 419 in FIG. 4) and column address associated with a first number of sense amplifiers and compute components to a shared I/O line (e.g., 455 in FIG. 4). In addition, the apparatus can be configured to move the data to a destination location, including a particular logic stripe associated with a compute unit 460 (FIG. 4) in a data path of the shared I/O line 455 (FIG. 4). As the reader will appreciate, each shared I/O line 455 (FIG. 4) can actually include a complementary pair of shared I/O lines (e.g., shared I/O line and shared I/O line* in FIG. 4). In some embodiments described herein, 2048 shared I/O lines (e.g., complementary pairs of shared I/O lines) can be configured as a 2048 bit wide shared I/O line. In some embodiments described herein, 1024 shared I/O lines (e.g., complementary pairs of shared I/O lines) can be configured as a 1024 bit wide shared I/O line.

FIG. 4 is a schematic diagram illustrating circuitry for data movement in a memory device in accordance with a number of embodiments of the present disclosure. FIG. 4 shows eight sense amplifiers (e.g., sense amplifiers 0, 1, . . . , 7 shown at 406-0, 406-1, . . . , 406-7, respectively) each coupled to a respective pair of complementary shared I/O lines 455 (e.g., shared I/O line and shared I/O line*). FIG. 4 also shows eight compute components (e.g., compute components 0, 1, . . . , 7 shown at 431-0, 431-1, . . . , 431-7) each coupled to a respective sense amplifier (e.g., as shown for sense amplifier 0 at 406-0) via respective pass gates 407-1 and 407-2 and digit lines 405-1 and 405-2. For example, the pass gates can be connected as shown in FIG. 3 and can be controlled by an operation selection signal, Pass. For example, an output of the selection logic can be coupled to the gates of the pass gates 407-1 and 407-2 and digit lines 405-1 and 405-2. Corresponding pairs of the sense amplifiers and compute components can contribute to formation of the sensing circuitry indicated at 450-0, 450-1, . . . , 450-7.

Data values present on the pair of complementary digit lines 405-1 and 405-2 can be loaded into the compute component 431-0 as described in connection with FIG. 3. For example, when the pass gates 407-1 and 407-2 are enabled, data values on the pair of complementary digit lines 405-1 and 405-2 can be passed from the sense amplifiers to the compute component (e.g., 406-0 to 431-0). The data values on the pair of complementary digit lines 405-1 and 405-2 can be the data value stored in the sense amplifier 406-0 when the sense amplifier is fired.

The sense amplifiers 406-0, 406-1, . . . , 406-7 in FIG. 4 can each correspond to sense amplifier 306 shown in FIG. 3. The compute components 431-0, 431-1, . . . , 431-7 shown in FIG. 4 can each correspond to compute component 331 shown in FIG. 3. A combination of one sense amplifier with one compute component can contribute to the sensing circuitry (e.g., 450-0, 450-1, . . . , 450-7) of a portion of a DRAM memory subarray 425 coupled to a shared I/O line 455 shared by a number of logic stripes in a data path of the shared I/O lines 455.

The configurations of embodiments illustrated in FIG. 4 are shown for purposes of clarity and are not limited to these configurations. For instance, the configuration illustrated in FIG. 4 for the sense amplifiers 406-0, 406-1, ..., 406-7 in combination with the compute components 431-0, 431-1, ..., 431-7 and the shared I/O line 455 is not limited to half the combination of the sense amplifiers 406-0, 406-1, ..., 406-7 with the compute components 431-0, 431-1, ..., 431-7 of the sensing circuitry being formed above the columns 422 of memory cells (not shown) and half being formed below the columns 422 of memory cells. Nor are the number of such combinations of the sense amplifiers with the compute components forming the sensing circuitry configured to couple to a shared I/O line limited to eight. In addition, the configuration of the shared I/O line 455 is not limited to being split into two for separately coupling each of the two sets of complementary digit lines 405-1 and 405-2, nor is the positioning of the shared I/O line 455 limited to being in the middle of the combination of the sense amplifiers and the compute components forming the sensing circuitry (e.g., rather than being at either end of the combination of the sense amplifiers and the compute components).

The circuitry illustrated in FIG. 4 also shows column select circuitry 458-1 and 458-2 that is configured to implement data movement operations with respect to particular columns 422 of a subarray 425, the complementary digit lines 405-1 and 405-2 associated therewith, and the shared I/O line 455 (e.g., as directed by the controller 140 shown in FIGS. 1A-1B). For example, column select circuitry 458-1 has select lines 0, 2, 4, and 6 that are configured to couple with corresponding columns, such as column 0 (432-0), column 2, column 4, and column 6. Column select circuitry 458-2 has select lines 1, 3, 5, and 7 that are configured to couple with corresponding columns, such as column 1, column 3, column 5, and column 7. The column select circuitry 458 described in connection with FIG. 4 can, in various embodiments, represent at least a portion of the functionality embodied by and contained in multiplexers, e.g., an eight (8) way multiplexer, sixteen (16) way multiplexer, etc.

Controller 140 can be coupled to column select circuitry 458 to control select lines (e.g., select line 0) to access data values stored in the sense amplifiers, compute components, and/or present on the pair of complementary digit lines (e.g., 405-1 and 405-2 when selection transistors 459-1 and 459-2 are activated via signals from select line 0). Activating the selection transistors 459-1 and 459-2 (e.g., as directed by the controller 140) enables coupling of sense amplifier 406-0, compute component 431-0, and/or complementary digit lines 405-1 and 405-2 of column 0 (422-0) to move data values on digit line 0 and digit line 0* to shared I/O line 455. For example, the moved data values may be data values from a particular row 419 stored (cached) in sense amplifier 406-0 and/or compute component 431-0. Data values from each of columns 0 through 7 can similarly be selected by controller 140 activating the appropriate selection transistors.

Moreover, enabling (e.g., activating) the selection transistors (e.g., selection transistors 459-1 and 459-2) can enable a particular sense amplifier and/or compute component (e.g., 406-0 and/or 431-0, respectively) to be coupled with a shared I/O line 455 such that data values stored by an amplifier and/or compute component can be moved to (e.g., placed on and/or transferred to) the shared I/O line 455. In some embodiments, one column at a time is selected (e.g., column 422-0) to be coupled to a particular shared I/O line 455 to move (e.g., copy, transfer, and/or transport) the stored data values. In the example configuration of FIG. 4, the shared I/O line 455 is illustrated as a shared, differential I/O line pair (e.g., shared I/O line and shared I/O line*). Hence, selection of column 0 (422-0) could yield two data values (e.g., two bits with values of 0 and/or 1) from a row (e.g., row 419) and/or as stored in the sense amplifier and/or compute component associated with complementary digit lines 405-1 and 405-2. These data values could be input in parallel to each shared, differential I/O pair (e.g., shared I/O and shared I/O*) of the shared differential I/O line 455.

FIG. 5 is a block diagram illustrating an example of a controller to a memory device in accordance with a number of embodiments of the present disclosure. In some implementations the block diagram provides greater detail of a portion of one example of a PIM capable device such as memory device 120 in FIGS. 1A-2. In the example of FIG. 5, a controller 540-1, ..., 540-7 (referred to generally as controller 540) may be associated with each bank 521-1, ..., 521-7 (referred to generally as 521) to the PIM capable device 520. Eight banks are shown in the example of FIG. 5. However, embodiments are not limited to this example number. Controller 540 may represent controller 140 shown in FIG. 1A. Each bank may include one or more arrays of memory cells (not shown). For example each bank may include one or more arrays such as array 130 in FIG. 1A and can include decoders, other circuitry and registers shown in FIG. 1A. In the example PIM capable device 520 shown in FIG. 5, controllers 540-1, ..., 540-7 are shown having control logic 531-1, ..., 531-7, sequencers 532-1, ..., 532-7, and timing circuitry 533-1, ..., 533-7 as part of a controller 540 on one or more memory banks 521 of a memory device 520. The PIM capable device 520 may represent part of memory device 120 shown in FIG. 1A.

As shown in the example of FIG. 5, the PIM capable device 520 may include a high speed interface (HSI) 541 to receive data, addresses, control signals, and/or commands at the PIM capable device 520. In various embodiments, the HSI 541 may be coupled to a bank arbiter 545 associated with the PIM capable device 520. The HSI 541 may be configured to receive commands and/or data from a host, e.g., 110 as in FIG. 1A. As shown in the example of FIG. 5, the bank arbiter 545 may be coupled to the plurality of banks 521-1, ..., 521-7.

In the example shown in FIG. 5, the control logic 531-1, ..., 531-7 may be in the form of a microcoded engine responsible for fetching and executing machine instructions, e.g., microcode instructions, from an array of memory cells, e.g., an array as array 130 in FIG. 1A, that is part of each bank 521-1, ..., 521-7. The sequencers 532-1, ..., 532-7 may also be in the form of microcoded engines. Alternatively, the control logic 531-1, ..., 531-7 may be in the form of a very large instruction word (VLIW) type processing resource and the sequencers 532-1, ..., 532-7, and the timing circuitry 533-1, ..., 533-7 may be in the form of state machines and transistor circuitry.

The control logic 531-1, ..., 531-7 may decode microcode instructions into function calls, e.g., microcode function calls (uCODE), implemented by the sequencers 532-1, ..., 532-7. The microcode function calls can be the operations that the sequencers 532-1, ..., 532-7 receive and execute to cause the PIM device 520 to perform particular logical operations using the sensing circuitry such as sensing circuitry 150 in FIG. 1A or using the compute component. The timing circuitry 533-1, ..., 533-7 may provide timing to coordinate performance of the logical operations and be responsible for providing conflict free access to the arrays such as array 130 in FIG. 1A.

As described in connection with FIG. 1A, the controllers 540-1, . . . , 540-7 may be coupled to sensing circuitry 150, compute unit, and/or additional logic circuitry 170, including cache, buffers, sense amplifiers, extended row address (XRA) latches, and/or registers, associated with arrays of memory cells via control lines and data paths shown in FIG. 5 as 555-1, 555-7. As such, sensing circuitry 150, compute unit, and logic 170 shown in FIG. 1A can be associated to the arrays of memory cells 130 using shared I/O line shown as 555-1, . . . , 555-7 in FIG. 5. The controllers 540-1, . . . , 540-7 may control regular DRAM operations for the arrays such as a read, write, copy, and/or erase operations, etc. Additionally, however, microcode instructions retrieved and executed by the control logic 531-1, . . . , 531-7 and the microcode function calls received and executed by the sequencers 532-1, . . . , 532-7 to cause sensing circuitry 150 and/or compute unit shown in FIG. 1A to perform additional logical operations such as addition, multiplication, or, as a more specific example, Boolean operations such as an AND, OR, XOR, etc., which are different, e.g., more complex, than regular DRAM read and write operations. Hence, in this PIM capable device 520 example, microcode instruction execution and logic operations can be performed on the banks 521-1, . . . , 521-7 of a PIM capable device 520.

According to embodiments, the control logic 531-1, . . . , 531-7, sequencers 532-1, . . . , 532-7, and timing circuitry 533-1, . . . , 533-7 can operate to generate sequences of operation cycles for a DRAM array and/or direct the performance of operations, e.g., logical operations, on the memory device 520, e.g., on a bank 521-1, . . . , 521-7 including in a compute unit in a data path of the shared I/O lines. In the PIM capable device 520 example, each sequence may be designed to perform operations, such as a Boolean logic operations AND, OR, XOR, etc., which together achieve a specific function. For example, the sequences of operations may repetitively perform a logical operation for a one (1) bit add in order to calculate a multiple bit sum. Each sequence of operations may be fed into a first in/first out (FIFO) buffer coupled to the timing circuitry 533-1, . . . , 533-7 to provide timing coordination with the sensing circuity 150, compute unit, and/or additional logic circuitry 170 associated with the array of memory cells 130, e.g., DRAM arrays, shown in FIG. 1A.

In the example PIM capable device 520 shown in FIG. 5, the timing circuitry 533-1, . . . , 533-7 can provide timing and can provide conflict free access to the arrays from four (4) FIFO queues and/or can coordinate timing to operations in the compute unit. In this example, one FIFO queue may support array computation, one may be for Instruction fetch, one for microcode (e.g., Ucode) instruction fetch, and one for DRAM I/O. Both the control logic 531-1, . . . , 531-7 and the sequencers 532-1, . . . , 532-7 can generate status information, which is routed back to the bank arbiter 545 via a FIFO interface. The bank arbiter 545 may aggregate this status data and report it back to a host 110 via interface (HSI) 541

Figure 6:
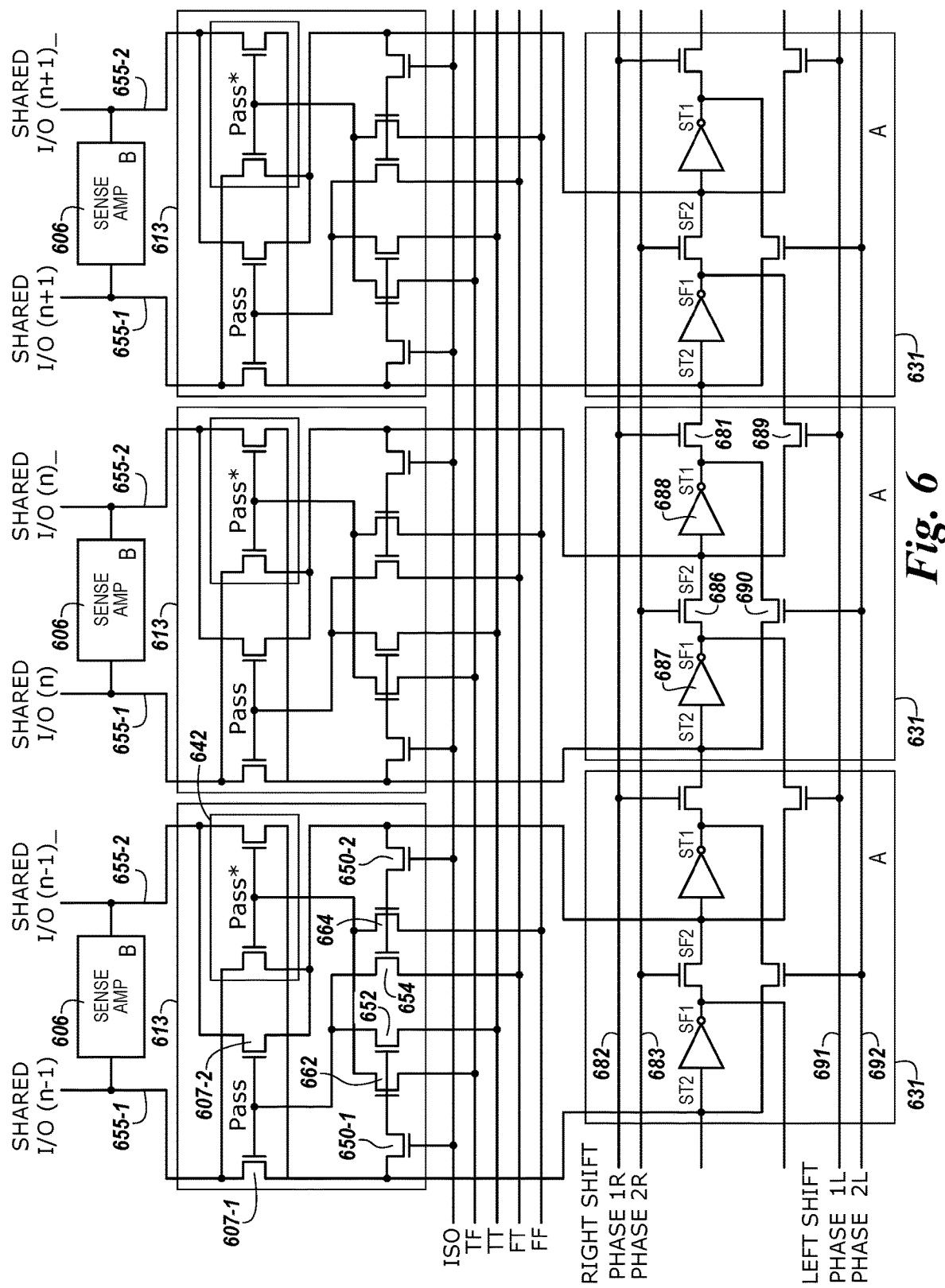
FIG. 6 is a schematic diagram illustrating sensing circuitry to a memory device in accordance with a number of embodiments of the present disclosure.

FIG. 6 is a schematic diagram illustrating compute unit circuitry capable of implementing an XOR logical operation in accordance with a number of embodiments of the present disclosure. FIG. 6 shows a sense amplifier 606 coupled to a pair of complementary shared I/O lines 655-1 and 655-2, logical operation select logic 613, and a compute component 631 coupled to the sense amplifier 606 via pass gates 607-1 and 607-2. The sense amplifier 606 shown in FIG. 6 can function in a manner analogous to the sense amplifier 306, e.g., primary latch, shown in FIG. 3 as associated with sensing circuitry 350. The compute component 631 shown in FIG. 6 can function analogous to the compute component 331, e.g., secondary latch, shown in FIG. 3 as associated with sensing circuitry 350. The logical operation selection logic 613 shown in FIG. 6 can function analogous to the logical operation selection logic 313 shown in FIG. 3 associated with sensing circuitry 350. The gates of the pass gates 607-1 and 607-2 can be controlled by a logical operation selection logic 613 signal, (e.g., Pass). For example, an output of the logical operation selection logic 613 can be coupled to the gates of the pass gates 607-1 and 607-2. Further, the compute component 631 can comprise a loadable shift register configured to shift data values left and right.

According to the embodiment illustrated in FIG. 6, the compute components 631 can comprise respective stages (e.g., shift cells) of a loadable shift register configured to shift data values left and right. For example, as illustrated in FIG. 6, each compute component 631 (e.g., stage) of the shift register comprises a pair of right-shift transistors 681 and 686, a pair of left-shift transistors 689 and 690, and a pair of inverters 687 and 688. The signals PHASE 1R, PHASE 2R, PHASE 1L, and PHASE 2L can be applied to respective control lines 682, 683, 691 and 692 to enable/disable feedback on the latches of the corresponding compute components 631 in association with performing logical operations and/or shifting data in accordance with embodiments described herein.

The compute unit circuitry shown in FIG. 6 shows operation selection logic 613 coupled to a number of logic selection control input control lines, including ISO, TF, TT, FT, and FF. Selection of a logical operation from a plurality of logical operations is determined from the condition of logic selection control signals on the logic selection control input lines, as well as the data values present on the pair of complementary shared I/O lines 655-1 and 655-2 when isolation transistors 650-1 and 650-2 are enabled via an ISO control signal being asserted.

According to various embodiments, the operation selection logic 613 can include four logic selection transistors: logic selection transistor 662 coupled between the gates of the swap transistors 642 and a TF signal control line, logic selection transistor 652 coupled between the gates of the pass gates 607-1 and 607-2 and a TT signal control line, logic selection transistor 654 coupled between the gates of the pass gates 607-1 and 607-2 and a FT signal control line, and logic selection transistor 664 coupled between the gates of the swap transistors 642 and a FF signal control line. Gates of logic selection transistors 662 and 652 are coupled to the true sense line through isolation transistor 650-1 (having a gate coupled to an ISO signal control line). Gates of logic selection transistors 664 and 654 are coupled to the complementary sense line through isolation transistor 650-2 (also having a gate coupled to an ISO signal control line).

Data values present on the pair of complementary shared I/O lines 655-1 and 655-2 can be loaded into the compute component 631 via the pass gates 607-1 and 607-2. The compute component 631 can comprise a loadable shift register. When the pass gates 607-1 and 607-2 are OPEN, data values ("A") on the pair of complementary shared I/O lines 655-1 and 655-2 are passed to the compute component 631 and thereby loaded into the loadable shift register. The data values on the pair of complementary shared I/O lines 655-1 and 655-2 can be the data value ("B") stored in the sense amplifier 606 when the sense amplifier is fired. In this example, the logical operation selection logic signal, Pass, is high to OPEN the pass gates 607-1 and 607-2.

The ISO, TF, TT, FT, and FF control signals can operate to select a logical function to implement based on the data value ("B") in the sense amplifier 606 and the data value ("A") in the compute component 631. In particular, the ISO, TF, TT, FT, and FF control signals are configured to select the logical function to implement independent from the data value present on the pair of complementary shared I/O lines 655-1 and 655-2 (although the result of the implemented logical operation can be dependent on the data value present on the pair of complementary shared I/O lines 655-1 and 655-2. For example, the ISO, TF, TT, FT, and FF control signals select the logical operation to implement directly since the data value present on the pair of complementary shared I/O lines 655-1 and 655-2 is not passed through logic to operate the gates of the pass gates 607-1 and 607-2.

Additionally, FIG. 6 shows swap transistors 642 configured to swap the orientation of the pair of complementary shared I/O lines 655-1 and 655-2 between the sense amplifier 606 and the compute component 631. When the swap transistors 642 are OPEN, data values on the pair of complementary shared I/O lines 655-1 and 655-2 on the sense amplifier 606 side of the swap transistors 642 are oppositely-coupled to the pair of complementary shared I/O lines 655-1 and 655-2 on the compute component 631 side of the swap transistors 642, and thereby loaded into the loadable shift register of the compute component 631.

The logical operation selection logic 613 signal Pass can be activated (e.g., high) to OPEN the pass gates 607-1 and 607-2 (e.g., conducting) when the ISO control signal line is activated and either the TT control signal is activated (e.g., high) with data value on the true shared I/O line is "1" or the FT control signal is activated (e.g., high) with the data value on the complement shared I/O line is "1."

The data value on the true shared I/O line being a "1" OPENs logic selection transistors 652 and 662. The data value on the complimentary shared I/O line being a "1" OPENs logic selection transistors 654 and 664. If the ISO control signal or either the respective TT/FT control signal or the data value on the corresponding shared I/O line (e.g., shared I/O line to which the gate of the particular logic selection transistor is coupled) is not high, then the pass gates 607-1 and 607-2 will not be OPENed by a particular logic selection transistor.

The logical operation selection logic signal Pass* can be activated (e.g., high) to OPEN the swap transistors 642 (e.g., conducting) when the ISO control signal line is activated and either the TF control signal is activated (e.g., high) with data value on the true shared I/O line is "1," or the FF control signal is activated (e.g., high) with the data value on the complement shared I/O line is "1." If either the respective control signal or the data value on the corresponding shared I/O line (e.g., shared I/O line to which the gate of the particular logic selection transistor is coupled) is not high, then the swap transistors 642 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary shared I/O lines together, which may be a disruptive configuration to be avoided.

The compute unit circuitry illustrated in FIG. 6 is configured to select one of a plurality of logical operations to implement directly from the four logic selection control signals (e.g., logical operation selection is not dependent on the data value present on the pair of complementary shared I/O lines). Some combinations of the logic selection control signals can cause both the pass gates 607-1 and 607-2 and swap transistors 642 to be OPEN at the same time, which shorts the pair of complementary shared I/O lines 655-1 and 655-2 together. According to a number of embodiments of the present disclosure, the logical operations which can be implemented by the compute unit circuitry illustrated in FIG. 6 can be the logical operations summarized in the logic tables shown in FIG. 7.

Figure 7:
FIG. 7 is a logic table illustrating selectable logic operation results implemented by a sensing circuitry shown in FIG. 3 in accordance with a number of embodiments of the present disclosure.

FIG. 7 is a logic table illustrating selectable logic operation results implemented by compute unit circuitry in a data path of a plurality of shared I/O lines 655-1 and 655-2 shown in FIG. 6 in accordance with a number of embodiments of the present disclosure. The four logic selection control signals (e.g., TF, TT, FT, and FF), in conjunction with a particular data value present on the complementary shared I/O lines, can be used to select one of plural logical operations to implement involving the starting data values ("A" and "B") stored in the sense amplifier 606, e.g., primary latch, and compute component 631, e.g., secondary latch, of the compute unit circuitry. The four control signals, in conjunction with a particular data value present on the complementary shared I/O lines, control the continuity of the pass gates 607-1 and 607-2 and swap transistors 642, which in turn affect the data value in the compute component 631 and/or sense amplifier 606 before/after firing. The capability to selectably control continuity of the swap transistors 642 facilitates implementing logical operations involving inverse data values (e.g., inverse operands and/or inverse result), among others.

Logic Table 7-1 illustrated in FIG. 7 shows the starting data value stored in the compute component 631, e.g., secondary latch, shown in column A at 744, and the starting data value stored in the sense amplifier 606, e.g., primary latch, shown in column B at 745. The other 3 column headings in Logic Table 7-1 refer to the continuity of the pass gates 607-1 and 607-2 shown if FIG. 6, and the swap transistors 642, which can respectively be controlled to be OPEN or CLOSED depending on the state of the four logic selection control signals (e.g., TF, TT, FT, and FF), in conjunction with a particular data value present on the pair of complementary shared I/O lines 655-1 and 655-2. The "Not Open" column corresponds to the pass gates 607-1 and 607-2 and the swap transistors 642 both being in a non-conducting condition, the "Open True" corresponds to the pass gates 607-1 and 607-2 being in a conducting condition, and the "Open Invert" corresponds to the swap transistors 642 being in a conducting condition. The configuration corresponding to the pass gates 607-1 and 607-2 and the swap transistors 642 both being in a conducting condition is not reflected in Logic Table 7-1 since this results in the sense lines being shorted together.

Via selective control of the continuity of the pass gates 607-1 and 607-2 and the swap transistors 642, each of the three columns of the upper portion of Logic Table 7-1 can be combined with each of the three columns of the lower portion of Logic Table 7-1 to provide 3×3=9 different result combinations, corresponding to nine different logical operations, as indicated by the various connecting paths shown at 775. The nine different selectable logical operations that can be implemented by the compute unit circuitry are summarized in Logic Table 7-2 illustrated in FIG. 7, including an XOR logical operation.

The columns of Logic Table 7-2 illustrated in FIG. 7 show a heading 780 that includes the state of logic selection control signals. For example, the state of a first logic selection control signal is provided in row 776 of the table 7-2, the state of a second logic selection control signal is provided in row 777 of the table 7-2, the state of a third logic selection control signal is provided in row 778 of the table 7-2, and the state of a fourth logic selection control signal is provided in row 779 of the table 7-2. The particular logical operation corresponding to the results is summarized in row 747 of the table 7-2.

While example embodiments including various combinations and configurations of sensing circuitry, sense amplifiers, compute components, logic stripes, shared I/O lines, column select circuitry, multiplexers, latch components, latch stripes, and/or latches, etc., have been illustrated and described herein, embodiments of the present disclosure are not limited to those combinations explicitly recited herein. Other combinations and configurations of the sensing circuitry, sense amplifiers, compute components, logic stripes, shared I/O lines, column select circuitry, multiplexers, latch components, latch stripes, and/or latches, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a plurality of neural networks, wherein each neural network of the plurality of neural networks operates within a corresponding bank of a plurality of banks of a processing in memory (PIM) device implemented on a chip, and wherein each neural network is configured to:
receive different training;
determine, via a plurality of compute components included in the corresponding bank, a characteristic of a particular portion of data simultaneously in response to receiving the different training; and
determine, via the plurality of compute components included in the corresponding bank, a training confidence factor of the characteristic of the particular portion of data based on the different training of each of the plurality of neural networks; and
a controller coupled to the plurality of neural networks, wherein the controller is configured to:
determine an accuracy of data recognition based on the training confidence factor of each of the plurality of neural networks using a voting scheme; and
determine the characteristic of the particular portion of data based on the accuracy of the data recognition.

2. The apparatus of claim 1, wherein the plurality of neural networks can include an array of memory cells coupled to sensing circuitry, wherein the sensing circuitry includes a sense amplifier and a compute component.

3. The apparatus of claim 2, wherein the array of memory cells is coupled to the sensing circuitry via a plurality of input/output (I/O) lines shared as a data path for in data path compute operations associated with the array configured to make the determination regarding the characteristic of the particular portion of data.

4. The apparatus of claim 1, wherein the plurality of neural networks are configured to be independently trained.

5. The apparatus of claim 1, wherein the plurality of neural networks are configured to simultaneously receive instructions to operate on the particular portion of data.

6. The apparatus of claim 1, wherein the particular portion of data is configured to be an image, portion of an image, sound, or emotion.

7. The apparatus of claim 1, wherein the plurality of neural networks are configured to operate in a fixed point or binary weighted network.

8. An apparatus, comprising:
a plurality of neural networks, wherein each neural network of the plurality of neural networks operates within a corresponding bank of a plurality of banks of a processing in memory (PIM) device implemented on a chip, and wherein each neural network is configured to:
receive different training;
receive a particular portion of data;
determine, via a plurality of compute components included in the corresponding bank, a characteristic of the particular portion of data simultaneously in response to receiving the different training; and
determine, via the plurality of compute components included in the corresponding bank, a training confidence factor of the characteristic of the particular portion of data based on the different training of each of the plurality of neural networks; and
a controller, wherein the controller is coupled to the plurality of neural networks and is configured to:
determine an accuracy of data recognition based on the training confidence factor of each of the plurality of neural networks using a voting scheme; and
determine the characteristic of the particular portion of data based on the accuracy of the data recognition.

9. The apparatus of claim 8, wherein the controller is configured to receive a vote from each of the plurality of neural networks.

10. The apparatus of claim 9, wherein the vote from each of the plurality of neural networks is evaluated by the controller.

11. The apparatus of claim 10, wherein the vote from each of the plurality of neural networks is evaluated based on type of particular portion of data and particular training of each of the plurality of neural networks.

12. The apparatus of claim 8, wherein the voting scheme is a majority rule.

13. The apparatus of claim 8, wherein the voting scheme is an average where a result of each neural network is averaged.

14. The apparatus of claim 8, wherein an output is provided by the controller based on the accuracy of the data recognition.

15. The apparatus of claim 14, wherein the output is discarded if there is no uniform decision on the accuracy of the data recognition among the plurality of neural networks.

16. The apparatus of claim 8, wherein the plurality of neural networks are configured as single-bit networks.

17. A method comprising:
    training each of a plurality of neural networks differently, wherein each neural network of the plurality of neural networks operates within a corresponding bank of a plurality of banks of a processing in memory (PIM) device implemented on a chip;
    determining, via the plurality of compute components included in the corresponding bank, a characteristic of a particular portion of data at each of the plurality of neural networks simultaneously in response to training each of the plurality of neural networks differently;
    determining, via the plurality of compute components in the corresponding bank, a training confidence factor of the characteristic of the particular portion of data based on the different training of each of the plurality of neural networks;
    determining an accuracy of data recognition based on the training confidence factor of each of the plurality of neural networks using a voting scheme at a controller; and
    determining the characteristic of the particular portion of data based on the accuracy of the data recognition at the controller.

18. The method of claim 17, wherein the method includes training each of the plurality of neural networks independently.

19. A method comprising:
    training each of a plurality of neural networks differently, wherein each neural network of the plurality of neural networks operates within a corresponding bank of a plurality of banks of a processing in memory (PIM) device implemented on a chip;
    operating the plurality of neural networks simultaneously in response to training each of the plurality of neural networks differently, wherein each of the plurality of neural networks receives a particular portion of data, determines, via a plurality of compute components included in the corresponding bank, a characteristic of the particular portion of data, and determines, via the plurality of compute components included in the corresponding bank, a training confidence factor of the characteristic of the particular portion of data based on the different training of each of the plurality of neural networks; and
    operating a controller, wherein the controller determines an accuracy of data recognition based on the training confidence factor of each of the plurality of neural networks using a voting scheme, and wherein the controller determines the characteristic of the particular portion of data based on the accuracy of the data recognition.

20. The method of claim 19, wherein a vote is received from each of the plurality of neural networks.

21. The method of claim 20, wherein the vote received from each of the plurality of neural networks is evaluated.

22. The method of claim 21, wherein the vote received from each of the plurality of neural networks is evaluated based on type of the particular portion of data and the different training of each of the plurality of neural networks.

23. The method of 19, wherein a majority rule is used as the voting scheme.

24. The method of 19, wherein an average is used as the voting scheme where a result of each of the plurality of neural networks is averaged.

25. The method of claim 19, wherein an output is provided based on the accuracy of the data recognition.

26. The method of claim 25, wherein no output is provided if there is no uniform decision on the accuracy of the data recognition among the plurality of neural networks.

\* \* \* \* \*